(12) United States Patent
Fukada

(10) Patent No.: US 8,028,145 B2
(45) Date of Patent: Sep. 27, 2011

(54) DATA STORAGE DEVICE

(75) Inventor: Shinichi Fukada, Hamura (JP)

(73) Assignee: Seiko Epson Corporation (JP)

( * ) Notice: Subject to any disclaimer, the term of this patent is extended or adjusted under 35 U.S.C. 154(b) by 1021 days.

(21) Appl. No.: 11/869,922

(22) Filed: Oct. 10, 2007

(65) Prior Publication Data

US 2008/0091913 A1   Apr. 17, 2008

(30) Foreign Application Priority Data

Oct. 16, 2006 (JP) ................................. 2006-281355

(51) Int. Cl.
*G06F 12/00* (2006.01)
(52) U.S. Cl. ........................................ 711/170; 711/103
(58) Field of Classification Search .................. 711/153, 711/154, 170, 173, 118, 129, 202, 205, 206, 711/207, 103, 206.207, 107; 710/68; 714/48, 714/6, 7; 345/555

See application file for complete search history.

(56) References Cited

U.S. PATENT DOCUMENTS

| 6,522,570 | B1 * | 2/2003 | Basceri et al. | 365/145 |
| 2008/0080225 | A1 * | 4/2008 | Fukada | 365/145 |
| 2008/0243711 | A1 * | 10/2008 | Aymeloglu et al. | 705/36 R |

FOREIGN PATENT DOCUMENTS

JP   2005-259041   9/2005

* cited by examiner

*Primary Examiner* — Kevin Ellis
*Assistant Examiner* — Mehdi Namazi
(74) *Attorney, Agent, or Firm* — Harness, Dickey & Pierce, P.L.C.

(57) ABSTRACT

A data storage device that performs a process of writing to a memory a plurality of measured data sets received in time series includes: a nonvolatile memory divided in a plurality of blocks to which the measured data is written; and a write control section that performs a processing including successively writing N sets of the measured data to a given block in the nonvolatile memory, and then successively writing next N sets of the measured data to another block, wherein the write control section judges whether or not the N sets of measured data lastly written to the given block of the nonvolatile memory and another N sets of measured data obtained after the N sets of measured data lastly written to the given block contain data with a value outside a predetermined range, writes new measured data to the given block such that the N sets of measured data lastly written to the given block are not overwritten when the data with a value outside the predetermined range is included, and writes new measured data to the given block such that at least one of the N sets of measured data lastly written to the given block is overwritten when the data with a value outside the predetermined range is not included.

8 Claims, 6 Drawing Sheets

DATA STORAGE DEVICE

The entire disclosure of Japanese Patent Application No. 2006-281355, filed Oct. 16, 2006 is expressly incorporated by reference herein.

BACKGROUND

1. Technical Field

The invention relates to data storage devices.

2. Related Art

Data storage devices (data log devices) that continuously obtain and record data on temperatures, vibrations, brightness, sounds, images and the like are known, and such data storage devices are used in, for example, temperature management of foods, drive recorders, flight recorders, voice recorders, seismometers, and the like.

In these data storage devices, when values of measured data exceed a predetermined range, it can be judged that a certain event has occurred on the subject being measured. By conducting an analysis processing on data obtained after the aforementioned data, the situation of the subject after the occurrence of the event can be learned. Also, by conducting an analysis processing on data for a certain period of time preceding the event, the situation of the subject before the occurrence of the event can be learned. Japanese laid-open patent application JP-A-2005-259041 may be an example of related art.

When the time interval for measuring (storing) data is made shorter in the data storage device, changes in the data can be accurately recorded. However, when the time interval for measuring data is shorter, the number of data increases, and a memory with a greater storage capacity is required for recording the data.

In contrast, when the time interval for measuring data is made longer, the number of data sets is reduced, and a memory with a smaller storage capacity can be used. However, the longer the time interval for measuring data, the more difficult it becomes to record minute changes in the data.

Also, in order to know the situation about the occurrence of the event, changes in the data before and after the occurrence of the event may preferably be analyzed. However, it is necessary to record data constantly to secure storage of measured data before and after the occurrence of the event, which requires a memory with a large storage capacity.

SUMMARY

In accordance with an aspect of an embodiment of the present invention, a data storage device is capable of storing necessary data, with a memory having a small storage capacity.

(1) A data storage device in accordance with an embodiment of the invention pertains to a data storage device that performs a process of writing to a memory a plurality of measured data sets received in time series, the data storage device including:

a nonvolatile memory divided in a plurality of blocks to which the measured data is written; and a write control section that performs a process including successively writing N sets of the measured data to a given block in the nonvolatile memory, and then successively writing next N sets of the measured data to another block, wherein the write control section judges whether or not the N sets of measured data lastly written to the given block of the nonvolatile memory and another N sets of measured data obtained after the N sets of measured data lastly written to the given block contain data with a value outside a predetermined range, writes new measured data to the given block such that the N sets of measured data lastly written to the given block are not overwritten when the data with a value outside the predetermined range is included, and writes new measured data to the given block such that at least one of the N sets of measured data lastly written to the given block is overwritten when the data with a value outside the predetermined range is not included.

According to the data storage device in accordance with the present embodiment, it is judged as to whether 2N sets of measured data including N sets of measure data written to a given block and N sets of measured data obtained thereafter combined include data with a value outside a predetermined range. It is noted that the value in the predetermined range is a value of measured data with which the subject being measured can be judged as being normal. In other words, when measured data has a value within the predetermined range, the measured data indicates that the subject being measured is in a normal state. Conversely, when measured data has a value outside the predetermined range, the measured data indicates that an abnormality is occurring on the subject being measured. In the present embodiment, when the 2N sets of measured data include data with a value outside the predetermined range, the N sets of measured data lastly written to the given block are judged to be data that need to be stored. Conversely, when all of the 2N sets of measured data are data with values inside the predetermined range, the N sets of measured data lastly written to the given block are judged to be data that do not need be stored.

For example, in accordance with the present embodiment, when N sets of measured data obtained after N sets of measured data lastly written to a given block include data that indicate an abnormality, the N sets of measured data lastly written to the given block are stored. Also, when N sets of measured data lastly written to a given block include data that indicates an abnormality, the N sets of measured data lastly written to the given block are stored.

Accordingly, in accordance with the present embodiment, N sets of measured data including data that indicates an abnormality, and N sets of measured data obtained before the above data are stored. In other words, at least N sets of measured data obtained before the data indicates an abnormality can be stored. Therefore, by conducting an analysis processing on the data, it is possible to determine a phenomenon that has occurred on the subject being measured during the process leading to the occurrence of the abnormality.

Furthermore, according to the data storage device, the necessity of N sets of measured data lastly written to a given block is judged by using measured data written to another block. Therefore, according to the data storage device, it is possible to control such that, until the necessity of N sets of measured data lastly written to a given block is judged, new data would not be written to the given block. Then, after the necessity of N sets of measured data lastly written to the given block has been judged, a write address (write start address) in the block may be set, which makes it possible to decide whether the N sets of data are to be overwritten, or the N sets of data are to be stored without being overwritten. Therefore, addresses of the memory can be used without any gaps, such that the memory capacity can be utilized without a waste.

It is noted that, in accordance with the present embodiment, when N sets of data lastly written to a given block are overwritten, all of the N sets of data may be overwritten, but the data set stored at the highest order (head data) may be left and only the remaining data sets may be overwritten. By this, data (head data) obtained at a wider time interval than the interval of obtaining measurement data can be stored. Therefore, the volume of stored data can be prevented from undesirably increasing, and the measured values can be recorded for a long time.

(2) In the data storage device in accordance with an aspect of the present embodiment, the write control section judges as to whether another N sets of measured data measured before the N sets of measured data lastly written to the given block include data with a value outside the predetermined range, and new measured data may be written to the given block such that the N sets of measured data lastly written to the given block are not overwritten, when the data with a value outside the predetermined range is included.

By this, data obtained after data that indicates the occurrence of an event can be stored.

For example, in accordance with the present embodiment, when N sets of measured data obtained before N sets of measured data lastly written to a given block include data indicating an abnormality, the N sets of measured data lastly written to the given block are stored. In other words, in accordance with the present embodiment, at least N sets of measured data obtained after data indicating an abnormality can be stored. Therefore, by conducting an analysis processing on the data, the state of the subject being measured after the occurrence of the abnormality can be analyzed.

(3) In the data storage device in accordance with an aspect of the present embodiment, the predetermined range may be a pre-set value.

(4) In the data storage device in accordance with an aspect of the present embodiment, the predetermined range may be a value set based on the measured data.

(5) In the data storage device in accordance with an aspect of the present embodiment, the write control section may include a write stop processing section that performs a control including judging whether the measured data meets a predetermined write stop condition, and stopping writing data to the nonvolatile memory when the predetermined write stop condition is met.

By this, data that has already been stored can be prevented from being lost. In particular, in the data storage device in accordance with the present embodiment, a nonvolatile memory is used as a storage section. For this reason, even when an unpredicted event occurs and the supply of power to the storage device is stopped, the data already stored can be prevented from being lost.

(6) The data storage device in accordance with an aspect of the present embodiment may further include a detection section that detects that a remaining amount of storage capacity of each of the blocks lowers below a predetermined value.

(7) In the data storage device in accordance with an aspect of the present embodiment, the write control section may judge whether the N sets of measured data lastly written to the given block meet a predetermined acquisition condition, and may write new measured data to the given block such that the N sets of measured data lastly written to the given block are not overwritten when the condition is met.

Data that meets the predetermined acquisition condition may be, for example, measured data obtained at an interval of L sets (L is an integer greater than N) among the measured data (or measured data obtained at a predetermined interval wider than the interval of obtaining measured data).

By this, continuous N sets of measured data are periodically stored, such that it is possible to confirm that the data storage device is normally operating.

(8) In the data storage device in accordance with an aspect of the present embodiment, when a write destination is switched from the other block to the given block, and new measured data is written to the given block, the write control section may control such that an address of any one of the N sets of measured data lastly written to the given block is designated, whereby at least one of the N sets of measured data lastly written to the given block is overwritten, or may control such that an address lower than addresses of the N sets of measured data lastly written to the given block is designated, whereby the N sets of measured data are not overwritten.

As a write address of new data, an address of any one of the addresses of the N sets of measured data may be designated, whereby the measured data written at addresses lower than the designated address are overwritten and erased. Therefore, the storage capacity can be utilized without a waste.

On the other hand, by designating an address lower than addresses at which the N sets of measured data are written as an address of new data, the N sets of measured data are stored without being overwritten, whereby necessary data can be stored.

(9) In the data storage device in accordance with an aspect of the present embodiment, the nonvolatile memory may be a ferroelectric memory.

A ferroelectric memory is generally known as having a great number of re-writing cycles, and a shorter re-writing time. For this reason, by using a ferroelectric memory as the nonvolatile memory, a data storage device with fewer limitations to the number of re-writing cycles and data acquisition time intervals can be provided.

DESCRIPTION OF EXEMPLARY EMBODIMENTS

Preferred embodiments of the invention are described below with reference to the accompanying drawings. It is noted that the invention is not limited to the embodiments described below. Also, the invention includes embodiments provided by optionally combining the contents described below.

FIGS. 1-7 are drawings for describing a data storage device (data log device) in accordance with an embodiment of the invention.

(1) Structure of Data Storage Device

Figure 1A:
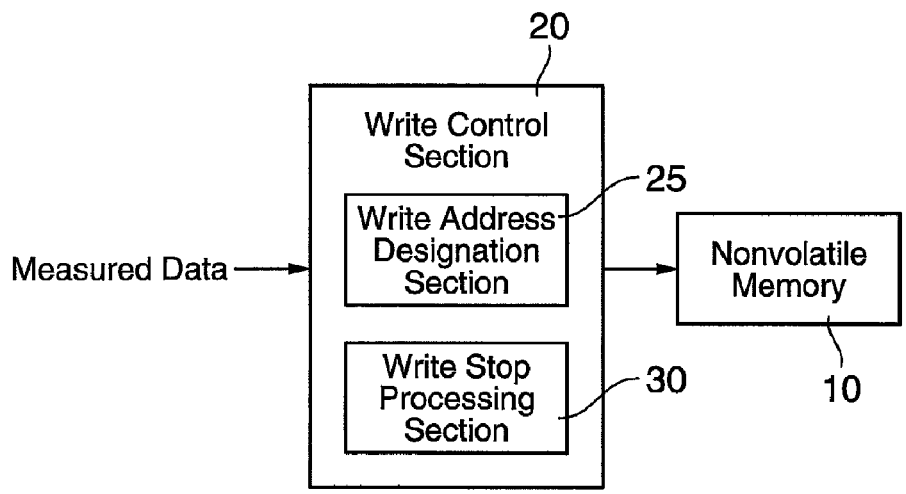
FIGS. 1A and 1B are figures for describing a structure of a data storage device.
Figure 1B:
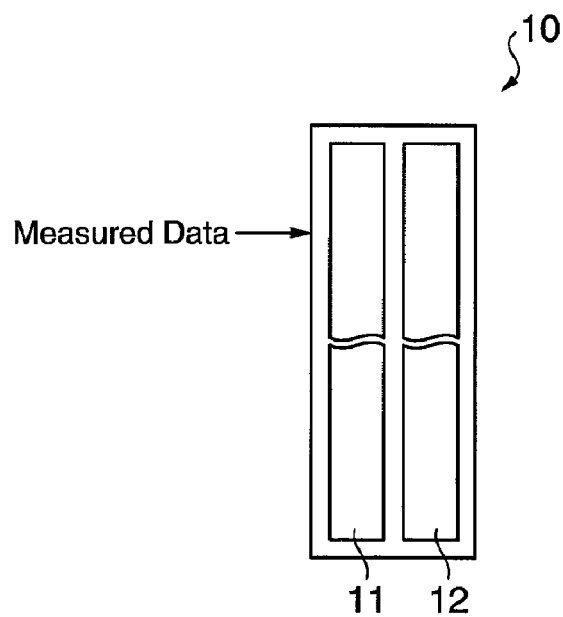

FIG. 1A is a functional block diagram of the data storage device 1 in accordance with the present embodiment. FIG. 1B is a schematic drawing of a nonvolatile memory 10 that is applicable to the present embodiment. Referring to FIGS. 1A and 1B, the structure of the data storage device 1 is described below.

The data storage device 1 in accordance with the present embodiment includes a nonvolatile memory 10, as shown in FIGS. 1A and 1B. A nonvolatile memory is a memory device in which stored data is not lost even when the power supply is cut off, in other words, a memory device that does not require external energy supply for retaining information. By using a nonvolatile memory, obtained information can be retained even when the supply of power from the data storage device 1 is stopped. The nonvolatile memory may be realized by, for example, using a capacitor that uses electrical hysteresis.

In the data storage device 1 in accordance with the present embodiment, a ferroelectric memory (FeRAM) may be used as the nonvolatile memory 10. In other words, the nonvolatile memory 10 may have a structure including a capacitor having ferroelectric material (ferroelectric capacitor). It is noted that the ferroelectric material applicable to the ferroelectric capacitor may not be particularly limited, and may be, for example, PZT ferroelectric material comprised of oxides containing Pb, Zr and Ti as constituent elements. Alternatively, as the ferroelectric material, any one of SBT (Sr,Bi,Ta), BST (Ba,Sr,Ti), BIT (Bi,Ti) and BLT (Bi,La,Ti) materials may be used. The ferroelectric capacitor may have a structure comprised of opposing electrodes and ferroelectric material provided between the opposing electrodes.

As shown in FIG. 1B, the nonvolatile memory 10 is divided into a plurality of blocks. In the example shown in FIG. 1B, the nonvolatile memory 10 is divided in two blocks, a first block 11 and a second block 12. It is noted however that, in accordance with the invention, the nonvolatile memory 10 may be divided into three or more blocks.

The data storage device 1 in accordance with the present embodiment includes a write control section 20. The write control section 20 controls write operations (processing) to write measured data to the nonvolatile memory 10. The write control section 20 designates addresses to write measured data in the nonvolatile memory 10, and performs an operation to write data to the nonvolatile memory 10. For example, the write control section 20 may include an address designation section 25 that designates write addresses in the nonvolatile memory 10. The write control section 20 writes measured data at addresses designated by the address designation section 25. It is noted that the address generation processing by the address designation section 25 is not particularly limited, and for example, may generate a next write address by adding the data size of measured data to (by incrementing) a current write address.

The write control section 20 performs a control including successively writing N sets of data to a given block (hereafter referred to as a "first block 11") of the nonvolatile memory 10, and then successively writing N sets of measured data to another block (hereafter referred to as a "second block 12"). Such a control may be realized by a process of successively designating addresses in the first block 11 by the address designation section 25, and writing N sets of data at the designated addresses in the first block, and then by a process of successively designating addresses in the second block 12 by the address designation section 25, and writing N sets of data at the designated addresses in the second block 12. In this instance, the address designation section 25 may successively designate addresses in each of the first and second blocks 11 and 12 from an upper address toward a lower address. It is noted that, when the nonvolatile memory 10 is divided in two blocks, the address designation section 25 designates addresses in the first block 11 and then designates addresses in the second block 12, and thereafter designates addresses in the first block 11 again. When the nonvolatile memory 10 includes M (M is an integer of 3 or greater) blocks, the address designation section 25 successively designates addresses in the first block toward addresses in the M-th block, and designates addresses in the first block again after writing N sets of data to the M-th block.

The data storage device 1 in accordance with the present embodiment may include a write stop processing section 30. The write stop processing section 30 may be included in the write control section 20, as shown in FIG. 1A. The write stop processing section 30 stops writing of measured data to the nonvolatile memory 10. The write stop processing section 30 judges whether measured data meets a predetermined write stop condition, and stops writing data to the nonvolatile memory 10 when the write stop condition is met. The write stop processing section 30, after obtaining data that meets the write stop condition, may immediately stop the writing operation. Alternatively, the write stop processing section 30, after obtaining data that meets the write stop condition, may stop the data writing operation after a predetermined time has elapsed.

Furthermore, the data storage device 1 may include a detection section that detects when the storage capacity decreases blow a predetermined value for each of the blocks. In this case, the address designation section 25 may control addresses to be designated based on detection signals from the detection section. The data storage device 1 may also include a write counter measurement section that counts the number of data writing (re-writing) at each address. Also, the data storage device 1 may cyclically use the nonvolatile memory 10 (the first and second blocks 11 and 12).

Also, the data storage device 1 may include a separation data write control section that writes separation data to the nonvolatile memory 10. The separation data write control section may perform a control to write separation data, after N sets of data have been written to one block, to an address next to the block.

Figure 2:
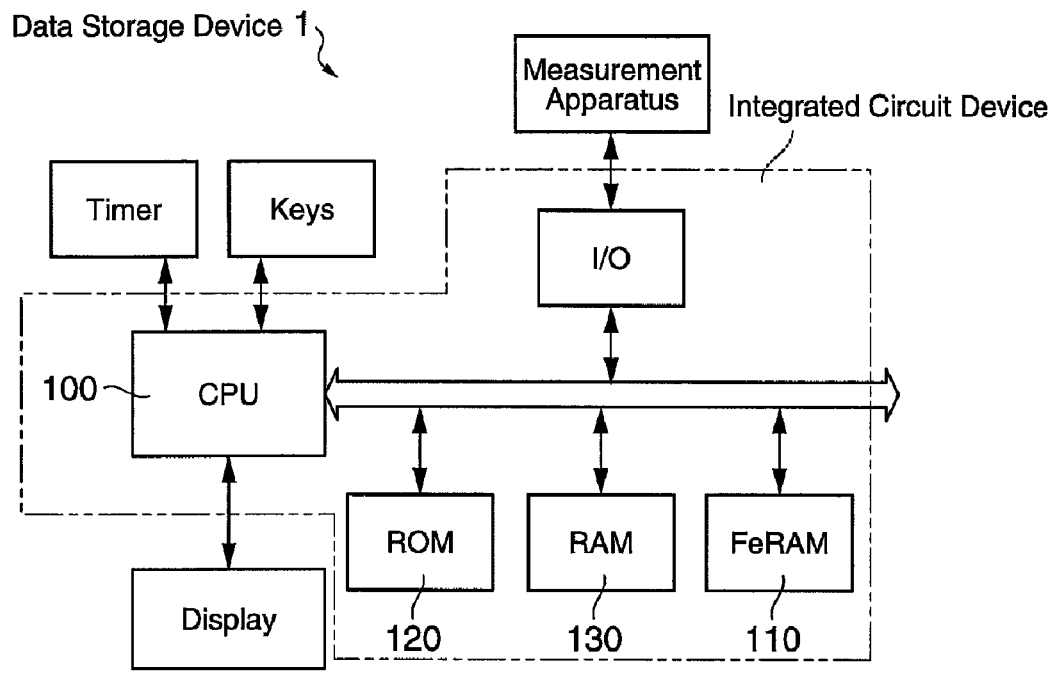
FIG. 2 is a block diagram of the data storage device.

Next, a concrete device structure of the data storage device 1 in accordance with the present embodiment is described. FIG. 2 is a block diagram of an example of a concrete device structure of the data storage device 1.

The data storage device 1 includes CPU 100. The CUP controls operations of the data storage device 1. For example, the CPU 100 decides write addresses in FeRAM 110 (a ferroelectric memory device as an example of the nonvolatile memory 10), successively designates the write addresses, and writes measured data at the designated addresses. In other words, the CUP 100 may function as the write control section 20. Also, the CPU 100 controls operation of a measuring apparatus, and may set intervals in data measurement (intervals to acquire measurement data). The FeRAM 110 functions as the nonvolatile memory 10.

The CPU 100 may control operations of the data storage device 1 based on a control program read from ROM 120. The CPU 100 may also control operations of the data storage device 1 based on measurement parameters stored in RAM 130. The measurement parameters may be information, for example, key-inputted and stored in the RAM 130. The functions of the RAM 130 may be realized by re-writable ROM such as EEPROM, and FeRAM.

In the data storage device 1, the CPU 100, the FeRAM 110, the ROM 120, the RAM 130 and the I/O interface may be composed in a single integrated circuit device (for example, a semiconductor chip). Further, the data storage device 1 may have the integrated circuit device control the measuring apparatus, and control generation of display image data for displaying an image on the display.

(2) Operation of Data Storage Device 1

Figure 3:
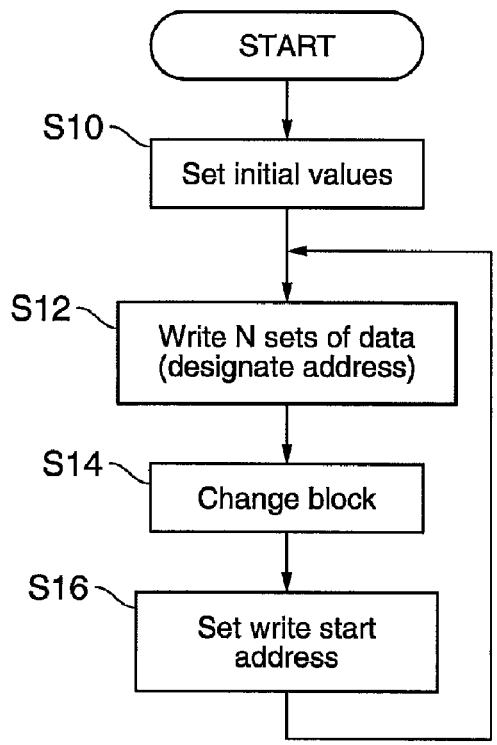
FIG. 3 is a flow chart for describing operations of the data storage device.

Operations of the data storage device 1 in accordance with the present embodiment are described below. FIG. 3 is a flow chart of operations of the data storage device 1.

First, initial values are set (step S10). The initial values may be, for example, an interval to measure data (an interval to acquire measured data), a range in which measured data is judged to be normal (the upper limit and the lower limit), a value of N that is the number of measured data sets continuously written to one block, an initial address, and the like. These initial values may be stored in the RAM 130. It is noted that the initial values may be set according to each subject to be measured.

Then, the address designation section 25 repeats a process of designating an address in a given block, and writing measured data at the designated address, thereby writing N sets of data in the given block (step S12). Then, the block to which data is written is changed (selected) (step S14), and a write start address (head address) of a new block is set (step S16).

Then, the address designation section 25 designates addresses from the write start address, and repeats the process of writing N sets of measured data (step S12).

Figure 4:
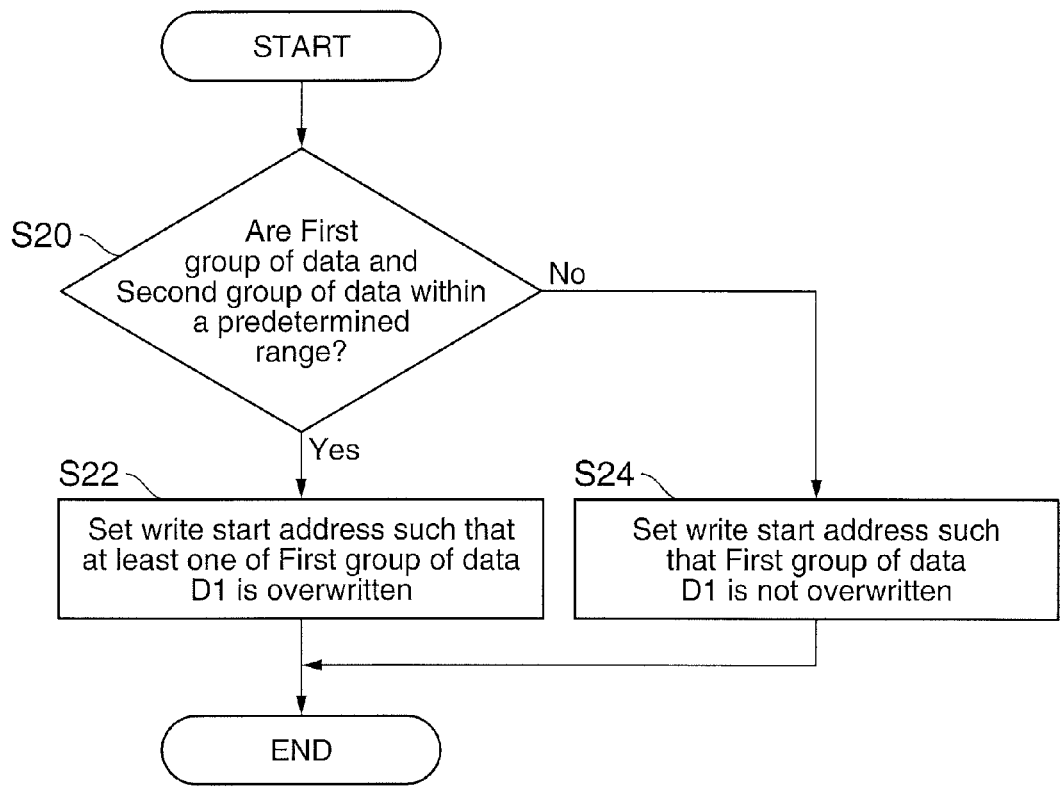
FIG. 4 is a flow chart for describing operations of the data storage device.
Figure 5A:
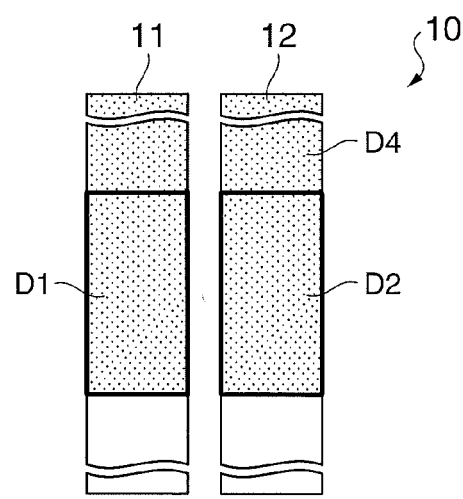
FIGS. 5A-5C are schematics showing how data is written to a nonvolatile memory.
Figure 5B:
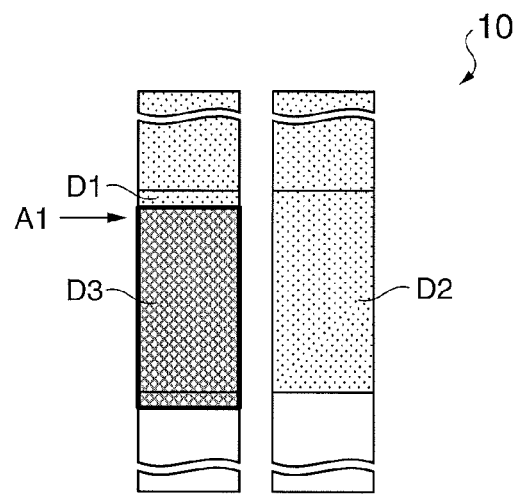
Figure 5C:
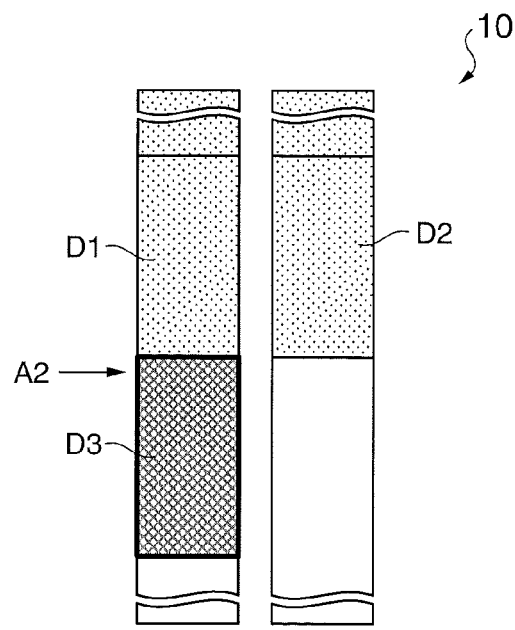
Figure 6:
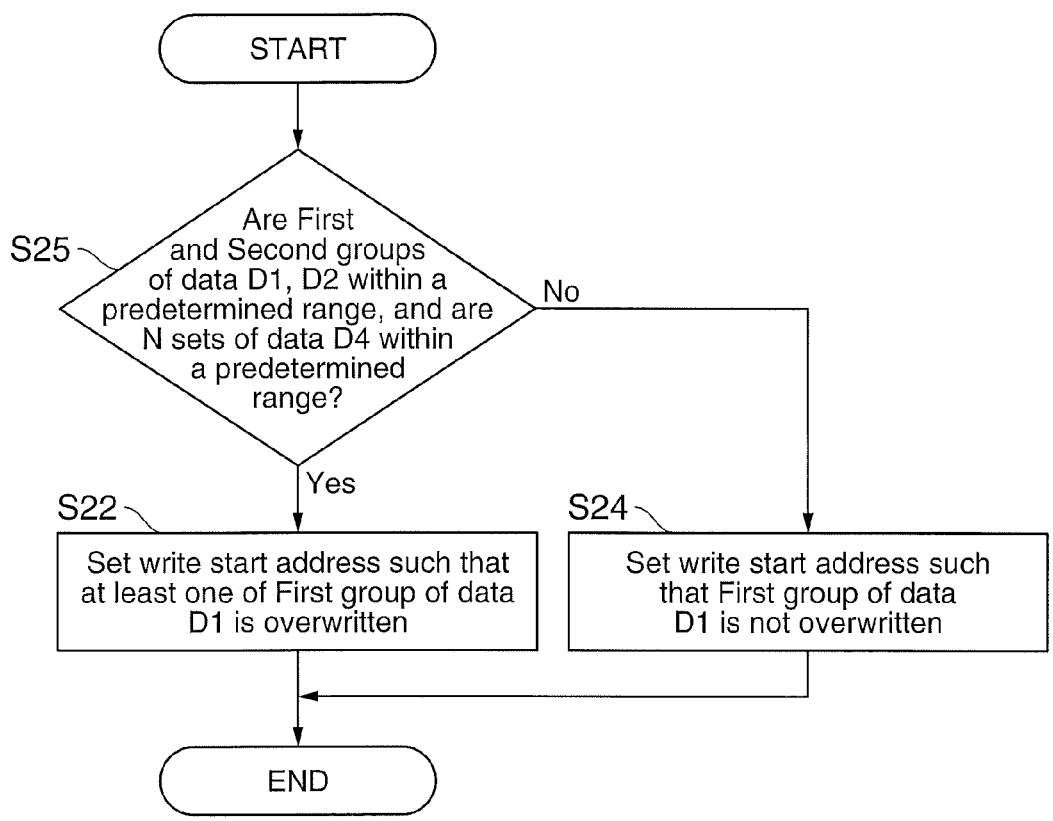
FIG. 6 is a flow chart for describing operations of the data storage device.

FIG. 4 is a flow chart for describing operations of the data storage device 1, in particular, a process of deciding a write start address of a new block (step S16). Here, the process is described using an example in which the first block 11 is selected as the new block. Also, FIGS. 5A-5C are schematics showing states in which data sets are written in the nonvolatile memory 10 in the data storage device 1.

First, a determination is made as to whether N sets of data lastly written (hereafter referred to as a "first group of data D1") among measured data written to the first block 11, and N sets of measured data obtained after the first group of data D1 (hereafter referred to as a "second group of data D2") are all data with values within a predetermined range (step S20). It is noted that the second group of data D2 may be N sets of data lastly written to the second block 12 among measured data sets written to the second block 12. Also, the second group of data D2 may be N sets of data before being written to the storage section 10 (the second block 12).

It is noted that the "value within a predetermined range" is a threshold value that defines at least one of the upper limit value or the lower limit value to be used for judging whether or not measured data indicates an occurrence of an event. In other words, when measured data has a value within the predetermined range, the measured data indicates that the subject being measured is normal. Conversely, when measured data has a value outside the predetermined range, the measured data indicates that an abnormality is occurring on the subject being measured. The "value within a predetermined range" may be, for example, a value that is defined beforehand based on each subject to be measured. Alternatively, the "value within a predetermined range" may be, for example, a value that is set based on measured data. For example, a value within a predetermined range may be set, through comparing with data measured immediately before.

It is noted that the first and second groups of data D1 and D2 may be the latest N sets of data among data written (N sets of data lastly written) to the first and second blocks 11 and 12, respectively. Also, the first and second groups of data D1 and D2 may be N sets of measured data continuously obtained, respectively.

Then, when all of the first and second groups of data D1 and D2 are data with values within the predetermined range (Yes in step S20), the write control section 20 sets a write start address such that at least one set of the first group of data D1 is overwritten (step S22), and writes new data to the first block 11 (step S12). For example, the address designation section 25 may designate any one of the addresses where the first group of data D1 are written as a write start address (an address A1 in FIG. 5B). In this case, as shown in FIG. 5B, the data written at addresses below the address A1 are overwritten by data D3 newly obtained, and erased. In this instance, the address at which data next to the head data of the first group of data D1 is written may be set as a write start address. In this case, data other than the head data of the first group of data D1 are overwritten and erased (see FIG. 5B). Also, when separation data is written after the first group of data D1, the separation data is also overwritten and erased.

Conversely, when at least one of the first and second groups of data D1 and D2 is data with a value outside the predetermined range (No in step S20), the write control section 20 sets a write start address such that the first group of data D1 is not overwritten (step S24), and writes new data to the first block 11 (step S12). For example, the address designation section 20 may designate an address after the addresses where the first group of data D1 are written (an address A2 in FIG. 5C) as a write start address. In this case, as shown in FIG. 5C, new data D3 is written, avoiding the first group of data D1, such that all of the data sets in the first group of data D1 are stored without being erased. When separation data is written after the first group of data D1, a write start address may be designated such that the separation data is not overwritten. By this, the separation data can be saved.

In the present embodiment of the invention, in the process of deciding a write start address in a new block (step S16), a write start address may be decided not only based on the first and second groups of data D1 and D2, but also based on N sets of data D4 measured before the first group of data D1. A process of deciding a write start address in this case is described with reference to FIG. 6.

First, a determination is made as to whether the first and second groups of data D1 and D2 have values within the predetermined range, and N sets of data D4 obtained before the first group of data D1 have values within the predetermined range (step S25).

When the first and second groups of data D1 and D2 have values within the predetermined range, and the N sets of data D4 have values within the predetermined range (Yes in step S25), the write control section 20 designates a write start address such that at least one data set in the first group of data D1 is overwritten (step S22), and writes new data to the first block 11 (step S12).

Conversely, when at least one of the first and second groups of data D1 and D2 includes data outside the predetermined range, or the N sets of data D4 include data outside the predetermined range (No in step S25), the write control section 20 designates a write start address such that the first group of data D1 is not overwritten (step S24), and writes new data to the first block 11 (step S12).

By this, when the N sets of data D4 obtained immediately before the first group of data D1 includes data that indicates the occurrence of an event, the first group of data D1 is saved, irrespective of the values of the first and second groups of data D1 and D2. For this reason, by the data storage device, data can be stored for a predetermined period after the occurrence of an event.

In other words, by the data storage device in accordance with the present embodiment, at least N sets of data obtained before the occurrence of an event, and at least N sets of data obtained after the occurrence of the event can be saved, such that changes in the data before and after the occurrence of the event can be analyzed.

More specifically, in accordance with the present embodiment of the invention, as described above, data is divided into N sets each (defined as a group), and each of them is treated as a group. Therefore, data at the time of occurrence of an event is included in any one of the groups. In other words, data at the time of occurrence of an event is written at a position between the head and the end of one of the groups. For example, when data at the time of occurrence of an event is written as head data of one of the groups, by saving data in a group before the aforementioned group, N sets of data before the occurrence of the event can be stored. Conversely, when data at the time of occurrence of an event is written as end data of one of the groups, by saving data in a group after the aforementioned group, N sets of data after the occurrence of the event can be stored. In other words, by saving N sets of data including the data at the time of occurrence of the event (data in one group) and data in groups before and after that group, changes in the data before and after the occurrence of the event can be analyzed because the data at the time of occurrence of the event, and at least N sets of data before and at least N sets of data after the occurrence of the event can be saved, no matter where the data at the time of occurrence of the event is written in the one group.

It is noted that, when the data storage device has a separation data write control section, a write start address may be designated such that the separation data is not overwritten, in the process of designating a write start address in a manner not to overwrite the first group of data D1 (step S24). For example, as a write start address, an address next to the address where separation data is written may be designated, whereby the separation data can be prevented from being overwritten. Conversely, when a write start address is designated in a manner that at least one data set in the first group of data D1 is overwritten (step S22), the address where the separation data is written is overwritten with new measured data, and the separation data does not remain. Therefore, separation data remains only after data not overwritten (data required for analysis), such that the position of the data required for analysis can be readily determined.

Further, in accordance with the present embodiment, when the first group of data D1 includes data that meets the predetermined condition (acquisition condition), in the process to decide a write start address of a new block, the first group of data D1 may be determined as data to be stored. For example, when the first group of data D1 includes data obtained at a predetermined interval wider than the interval to obtain measurement data (measurement interval), the first group of data D1 may be determined as data to be stored. By this, even when an event does not occur, measured data is periodically stored, such that normal operation of the data storage device can be confirmed. Alternatively, when the second group of data D2 uses more addresses than the first group of data D1, the first group of data D1 may be judged as data to be stored. By this, a difference in the used memory areas can be adjusted. A situation in need of attention is that, when data D2 has already been written after data D4, and the data D4 was not judged as data to be stored at the time of writing the data D2, the data D4 has already been overwritten by the data D2, and only data in less than N sets may remain.

Figure 7:
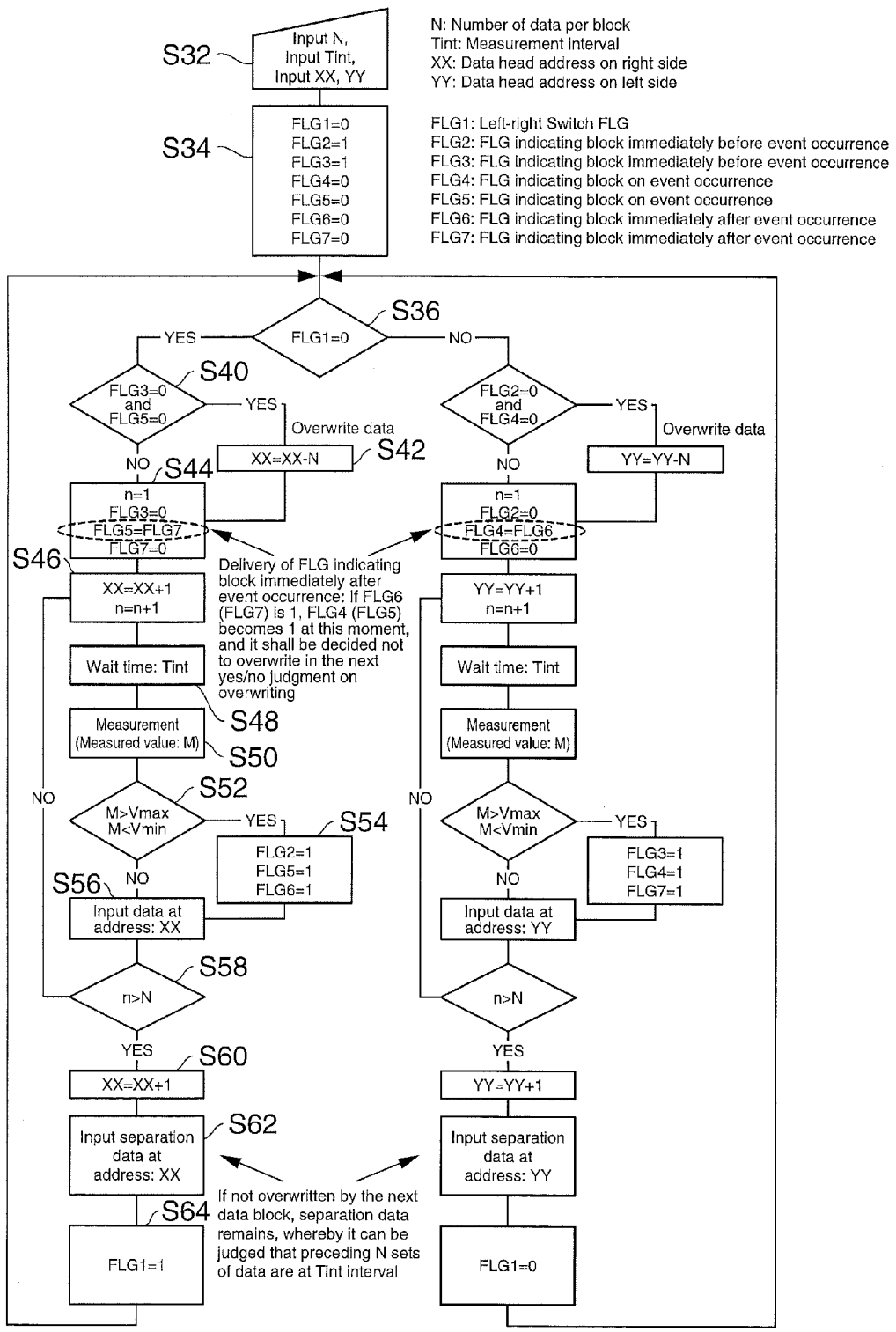
FIG. 7 is a flow chart for describing operations of the data storage device.

Next, an algorithm to realize the data storage device is described with reference to FIG. 7.

First, initial values are inputted (step S32, S34). In step S32, a value of N that is the number of data sets continuously written to one block by the write control section 20, a time interval to measure measurement data Tint, and head addresses XX and YY in the first and second blocks, respectively, are designated. Also, in step S34, initial values of flags are set.

Then, a block to which data is to be written is selected (step S36). In the present embodiment, for example, in the case of FLG1=0, the first block 11 may be set to be selected, in the case of FLG1≠0, the second block 12 may be set to be selected.

Then, a write start address of the selected block is decided (step S40, step S42). In this example, in the case of FLG3=0 and FLG5=0 (Yes in step S40), a processing to increment an address to overwrite data is performed (step S42 (corresponding to step S22)). When at least one of FLG3 and FLG5 is not zero (0) (No in step S40), the processing to increment an address is not performed, and the process advances to the next step (corresponding to step S24).

Then, a flag delivery processing is conducted (step S44), and a data writing (storing) processing is conducted (step S46-step S58).

In the data writing processing, first, a write address and a counter value are set (step S46). Then, after the waiting time Tint has elapsed (step S48), data measurement is conducted (step S50), and a judgment is made as to whether the measured data has a value within a predetermined range (step S52).

When the value of the measured data is outside the predetermined range (Yes in step S52), flag values are set (step S54), and a data write processing is conducted (step S56). It is noted that, in the present embodiment, by the flag set in step S54, addresses in the first and second blocks are set, and overwriting of data is restricted (steps S40-S44).

When the value of the measured data is within the predetermined range (No in step S52), the data write processing is conducted without changing the flag values (step S56).

Then, a judgment is made as to whether N sets of data are written to the first block 11 (step S58), and the data writing processing is repeated until N sets of data are written.

When N sets of data are written to the first block 11, the addressed is counted up to set a separation data input address (step S60), and a separation data write processing to write separation data at the separation data input address is conducted (step S62).

Then the value of FLG1 is set (step S64), thereby selecting another block (step S36), and similar processings as described above are repeated.

In accordance with the present embodiment, write addresses may be set by setting flags, as described above. By this, addresses can be set by transferring data with a small size, such that a data storage device having little data processing loads and a small circuit size can be provided.

(3) Effects

The data storage device in accordance with the embodiment of the invention is structured in a manner described above. According to the data storage device, it is possible to provide a data storage device that is capable of effectively using its storage area. Its effects are described below.

As described above, in the data storage device 1, based on N sets of measured data written to the first block 11 (first group of data D1) and N sets of measured data obtained thereafter (second group of data D2), the necessity of the first group of data D1 is judged. In other words, in the data storage device of the present embodiment, whether the N sets of measured data (first group of data D1) are to be stored or not is judged, using the measured data obtained thereafter (second group of data D2). Thus, according to the data storage device, the necessity of storing N sets of measured data is judged after a predetermined time has elapsed since the N sets of measured data was obtained (written to the storage section), and the N sets of measured data are retained until the necessity of their storage is judged. For this reason, when measured data that indicates the occurrence of an event is obtained, data prior to the occurrence of the event can be stored.

For example, when the second group of data D2 includes data that indicates the occurrence of an event (data having a value outside the predetermined range), by storing the second group of data D2, and N sets of measured data obtained immediately before them (first group of data D1), at least N sets of data before the occurrence of the event can be stored, no matter where the data indicating the occurrence of the event is disposed between the head and the end of the second group of data D2.

Also, in the data storage device 1, after N sets of measured data are written to the first block 11, N sets of measured data are written to the second block 12. Then, after the necessity of storing the N sets of measured data written to the first block 11 (first group of data D1) is determined, write addresses in the first block 11 are designated. In other words, according to the data storage device 1, before new data is written to the first block 11, the necessity of the first group of data D1 (N sets of data most recently obtained among data written to the first block 11) can be judged.

Then, based on the necessity of the N sets of measured data, a decision is made as to whether the first group of data D1 is to be overwritten (overwritten and erased), or stored without being overwritten. Concretely, by designating an address after the addresses where the first group of data D1 is written as a write address of the new data, the first group of data D1 can be saved. Conversely, as a write address of new data, any one of the addresses where the first group of data D1 is written may be designated, whereby the measured data written at addresses after the designated address is overwritten and erased. Therefore, it is possible to provide a data storage device that is capable of using addresses in the first block 11 from its uppermost address without a gap, while it is capable of judging the necessity of the first group of data D1.

It is noted that, in the data storage device, when N sets of data written to the first block (first group of data D1) are data not necessary to be stored, the address designation section may designate an address after the address at which the head data of the N sets of data in the first block is written. By this, the head data (data obtained at a predetermined interval longer than the measurement data acquisition interval) is stored regardless of the presence or absence of the occurrence of an event, changes in the data for an extended period of time can be confirmed. It is noted that the head data is data that is obtained at a time interval wider than the measurement data acquisition interval (N×Tint interval), and the volume of data would not considerably increase even when the head data is stored. Therefore, without using a memory of a large storage capacity, measured data can be stored for an extended period of time. It is noted here that the head data may be one data set, or may be a plurality of data sets.

The invention is not limited to the embodiments described above, and many modifications can be made. The invention may include compositions that are substantially the same as the compositions described in the embodiments (for example, a composition with the same function, method and result, or a composition with the same object and result). Also, the invention includes compositions in which portions not essential in the compositions described in the embodiments are replaced with others. Also, the invention includes compositions that achieve the same functions and effects or achieve the same objects of those of the compositions described in the embodiments. Furthermore, the invention includes compositions that include publicly known technology added to the compositions described in the embodiments.

What is claimed is:

1. A data storage device that performs a process of writing to a memory a plurality of measured data sets received in time series, the data storage device comprising:
a nonvolatile memory divided in a plurality of blocks to which the measured data is written; and
a write control section that performs a processing including successively writing N sets of the measured data to a given block in the nonvolatile memory, and then successively writing next N sets of the measured data to another block,
wherein the write control section judges whether or not the N sets of measured data lastly written to the given block of the nonvolatile memory and another N sets of measured data obtained after the N sets of measured data lastly written to the given block contain data with a value outside a predetermined range, writes new measured data to the given block such that the N sets of measured data lastly written to the given block are not overwritten when the data with a value outside the predetermined range is included, and writes new measured data to the given block such that at least one of the N sets of measured data lastly written to the given block is overwritten when the data with a value outside the predetermined range is not included; and
wherein, when a write destination is switched from the other block to the given block, and new measured data is written to the given block, the write control section controls such that an address of any one of the N sets of measured data lastly written to the given block is designated, whereby at least one of the N sets of measured data lastly written to the given block is overwritten, and controls such that an address lower than addresses of the N sets of measured data lastly written to the given block is designated, whereby the N sets of measured data are not overwritten.

2. A data storage device according to claim 1, wherein the write control section judges as to whether another N sets of measured data measured before the N sets of measured data lastly written to the given block include data with a value outside the predetermined range, and new measured data is written to the given block such that the N sets of measured data lastly written to the given block are not overwritten, when the data with a value outside the predetermined range is included.

3. A data storage device according to claim 1, wherein the predetermined range is a pre-set value.

4. A data storage device according to claim 1, wherein the predetermined range is a value set based on the measured data.

5. A data storage device according to claim 1, wherein the write control section includes a write stop processing section that performs a control including judging whether the measured data meets a predetermined write stop condition, and stopping writing data to the nonvolatile memory when the predetermined write stop condition is met.

6. A data storage device according to claim 1, further comprising a detection section that detects that a remaining amount of storage capacity of each of the blocks lowers below a predetermined value.

7. A data storage device according to claim 1, wherein the write control section judges whether the N sets of measured data lastly written to the given block meet a predetermined acquisition condition, and writes new measured data to the given block such that the N sets of measured data lastly written to the given block are not overwritten when the condition is met.

8. A data storage device according to claim 1, wherein the nonvolatile memory is a ferroelectric memory.

* * * * *